United States Patent
Sun et al.

(10) Patent No.: US 12,041,773 B2
(45) Date of Patent: Jul. 16, 2024

(54) THREE-DIMENSIONAL NAND MEMORY DEVICE AND METHOD OF FORMING THE SAME

(71) Applicant: Yangtze Memory Technologies Co., Ltd., Hubei (CN)

(72) Inventors: Zhongwang Sun, Wuhan (CN); Rui Su, Wuhan (CN); Wenxi Zhou, Wuhan (CN); Zhiliang Xia, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 765 days.

(21) Appl. No.: 17/113,484

(22) Filed: Dec. 7, 2020

(65) Prior Publication Data
US 2021/0225872 A1 Jul. 22, 2021

Related U.S. Application Data

(63) Continuation of application No. PCT/CN2020/073438, filed on Jan. 21, 2020.

(51) Int. Cl.
*H10B 43/27* (2023.01)
*G11C 8/14* (2006.01)
(Continued)

(52) U.S. Cl.
CPC .............. *H10B 43/27* (2023.02); *G11C 8/14* (2013.01); *H10B 43/10* (2023.02); *H10B 43/35* (2023.02)

(58) Field of Classification Search
CPC ........ H10B 43/10; H10B 43/27; H10B 43/35; H10B 43/50; H10B 41/10; H10B 41/20; H10B 41/23; H10B 41/27; H10B 41/35; H10B 41/41; H10B 41/50; H01L 27/0688; H01L 27/2481; H01L 27/1052; H01L 27/11551; H01L 27/11578;
(Continued)

(56) References Cited

U.S. PATENT DOCUMENTS 9,853,049 B2 12/2017 Kim et al.
10,950,623 B2 3/2021 Song et al.
(Continued)

FOREIGN PATENT DOCUMENTS

| CN | 107305895 A | 10/2017 |
| CN | 109690776 A | 4/2019 |
| CN | 110211964 A | 9/2019 |

*Primary Examiner* — Natalia A Gondarenko
(74) *Attorney, Agent, or Firm* — Oblon, McClelland, Maier & Neustadt, L.L.P.

(57) ABSTRACT

A semiconductor device is provided. The semiconductor device includes a stack of word line layers and insulating layers that are stacked alternatingly over a substrate. The semiconductor device also includes a first dielectric trench structure. The first dielectric trench structure is positioned in a bottom select gate (BSG) layer of the word line layers to separate the BSG layer and extends in a first direction of substrate. The semiconductor device further includes a second dielectric trench structure. The second dielectric trench structure is positioned in a top select gate (TSG) layer of the word line layers to separate the TSG layer and extends in the first direction of the substrate. The second dielectric trench structure is offset from the first dielectric trench structure in a second direction of the substrate that is perpendicular to the first direction.

15 Claims, 16 Drawing Sheets

(51) Int. Cl.
*H10B 43/10* (2023.01)
*H10B 43/35* (2023.01)

(58) Field of Classification Search
CPC ... H01L 27/11582; H01L 29/04; H01L 29/16; H01L 29/4234; H01L 29/42352; H01L 29/511; H01L 29/518; H01L 29/66825; H01L 29/66833; H01L 29/7883; H01L 29/792; H01L 29/7926; H01L 29/1033; H01L 27/11556; H01L 27/11524; H01L 27/11565; H01L 27/11568; H01L 27/11519; H01L 27/1157; H01L 27/115; H01L 27/11597; A01G 25/023; G11C 8/14; G11C 16/0408
USPC .................. 257/314, 326, 329, 368, 29.262
See application file for complete search history.

(56) References Cited

U.S. PATENT DOCUMENTS

| | | | |
|---|---|---|---|
| 2017/0309635 A1 | 10/2017 | Kim et al. | |
| 2018/0233206 A1 | 8/2018 | Yu et al. | |
| 2018/0374961 A1* | 12/2018 | Kim ..................... | H10B 41/27 |
| 2020/0185408 A1 | 6/2020 | Song et al. | |
| 2020/0365616 A1* | 11/2020 | Baek ..................... | H10B 43/50 |
| 2021/0143179 A1 | 5/2021 | Song et al. | |
| 2021/0143180 A1 | 5/2021 | Song et al. | |
| 2021/0151462 A1* | 5/2021 | Baek ..................... | H10B 41/27 |

* cited by examiner

THREE-DIMENSIONAL NAND MEMORY DEVICE AND METHOD OF FORMING THE SAME

RELATED APPLICATION

This application is a bypass continuation of International Application No. PCT/CN2020/073438, filed on Jan. 21, 2020. The entire disclosure of the prior application is hereby incorporated by reference in its entirety.

BACKGROUND

As critical dimensions of devices in integrated circuits shrink to the limits of common memory cell technologies, designers have been looking to techniques for stacking multiple planes of memory cells to achieve greater storage capacity, and to achieve lower costs per bit. A 3D-NAND memory device is an exemplary device of stacking multiple planes of memory cells to achieve greater storage capacity, and to achieve lower costs per bit. As 3D NAND technology migrates towards higher densities and high capacities, especially from a 64 L to 128 L architecture, the number of word line layers (or gate control layers) in a vertical direction perpendicular to a substrate has been increasing significantly. The increasing number of word line layers leads to a dramatic increase of block size of the 3D-NAND memory device, which in turn can induce longer read and erase times, longer data transfer time, and lower storage efficiency.

SUMMARY

According to an aspect of the present disclosure, a semiconductor device is provided. The semiconductor device includes a stack of word line layers and insulating layers that are stacked alternatingly over a substrate. The semiconductor device also includes a first dielectric trench structure. The first dielectric trench structure is positioned in a bottom select gate (BSG) layer of the word line layers to separate the BSG layer into two portions and extends in a first direction of substrate. The semiconductor device further includes a second dielectric trench structure. The second dielectric trench structure is positioned in a top select gate (TSG) layer of the word line layers to separate the TSG layer into two portions and extends in the first direction (e.g., a length direction) of the substrate. The second dielectric trench structure is offset from the first dielectric trench structure in a second direction (e.g., a width direction) of the substrate that is perpendicular to the first direction.

The semiconductor device can include a first slit structure and a second slit structure. The first slit structure can be positioned at a first boundary of the stack, where the first slit structure extends through the stack and extends along the first direction of the substrate. The second slit structure can be positioned at a second boundary of the stack, where the second slit structure extends through the stack and extends along the first direction of the substrate.

In some embodiments, the first dielectric trench structure and the second dielectric trench structure can be disposed between the first slit structure and the second slit structure in the second direction of the substrate. In addition, the first dielectric trench structure, the second dielectric trench structure, the first slit structure, and the second slit structure can extend parallel to each other in the first direction of the substrate.

The semiconductor device can include a plurality of channel structures that is formed over the substrate and further extends through the stack, where the channel structures are disposed between the first slit structure and the second slit structure. The semiconductor device can further include a plurality of dummy channel structures that is formed over the substrate and further extends through the stack, where the dummy channel structures are disposed between the first slit structure and the second slit structure.

In some embodiments, the first dielectric trench structure extends across a first set of the dummy channel structures, and the second dielectric trench structure extends across a second set of the dummy channel structures.

In some embodiments, the TSG layer can be an uppermost word line layer of the word line layers, and the BSG layer can be a lowermost word line layer of the word line layers.

In some embodiments, the semiconductor device can include a first region, a second region, and a third region. The first region is defined by the first slit structure and the second dielectric trench structure. The second region that is defined by the first dielectric trench structure and the second dielectric trench structure. The third region that is defined by the first dielectric trench structure and the second slit structure. The first region, the second region, and the third region are configured to operate independently.

According to another aspect of the present disclosure, a method for manufacturing a semiconductor device is provided. In the disclosed method, a plurality of first insulating layers and a dummy bottom select gate (BSG) layer are formed over a substrate. The dummy BSG layer is disposed between the first insulating layers. A first dielectric trench structure is subsequently formed. The first dielectric trench structure passes through the dummy BSG layer, and extends in a first direction (e.g., a length direction) of the substrate. The dummy BSG layer is separated by the first dielectric trench structure into two portions. A plurality of sacrificial word line layers and a plurality of second insulating layers are then formed over the first insulating layers, where the second insulating layers and the sacrificial word line layers are disposed alternatingly. Further, a second dielectric trench structure is formed, where the second dielectric trench structure passes through a sacrificial top select gate (TSG) layer of the sacrificial word line layers to separate the sacrificial TSG layer into two portions and extends in the first direction of the substrate. The second dielectric trench structure is offset from the first dielectric trench structure in a second (or width) direction of the substrate.

In some embodiment, before the second dielectric trench structure is formed, a trim-etch process can be performed on the first insulating layers, the dummy BSG layer, the sacrificial word line layers, and the second insulating layers to form an array region and staircase regions over the substrate, where the staircase regions are positioned at two sides of the array region.

In some embodiments, channel structures can be formed in the array region, where the channel structures extend from the substrate and extend through the first insulating layers, the dummy BSG layer, the sacrificial word line layers, and the second insulating layers in the array region. Moreover, a first slit structure can be formed to be positioned at first boundaries of the array region and the staircase regions, and a second slit structure can be formed to be positioned at second boundaries of the array region and the staircase regions. The first slit structure and the second slit structure extend through the first insulating layers, the dummy BSG layer, the sacrificial word line layers, and the second insulating layers, and further extend along the first direction of the substrate. Subsequently, the dummy BSG layer can be replaced with a BSG layer and the sacrificial word line layers can be replaced with word line layers. Contact structures can be formed on the staircase regions, where the contact structures are connected to the BSG layer and the word line layers in the staircase regions.

In the disclosed method, the first dielectric trench structure and the second dielectric trench structure are disposed between the first slit structure and the second slit structure in the second direction of the substrate. In addition, the first dielectric trench structure, the second dielectric trench structure, the first slit structure, and the second slit structure extend parallel to each other in the first direction of the substrate.

According to yet another aspect of the disclosure, a semiconductor device is provided. The semiconductor device includes an array region and staircase regions formed in a stack, where the staircase regions are positioned at two sides of the array region, and the stack includes word line layers and insulating layers that are alternatingly stacked over a substrate. The semiconductor device includes a first slit structure and a second slit structure. The first slit structure is positioned at first boundaries of the array region and the staircase regions, and extends through the stack and along a first (or length) direction of the substrate. The second slit structure is positioned at second boundaries of the array region and the staircase regions, and extends through the stack and along the first direction of the substrate.

The semiconductor further has a first dielectric trench structure and a second dielectric trench structure. The first dielectric trench structure is disposed between the first and second slit structures, positioned in a bottom select gate (BSG) layer of the word line layers to separate the BSG layer into two portions, and extends in the first direction of the substrate. The second dielectric trench structure is disposed between the first and second slit structures, positioned in a top select gate (TSG) layer of the word line layers to separate the TSG layer into two portions, and extends in the first direction of the substrate. The second dielectric trench structure is offset from the first dielectric trench structure in a second direction of the substrate.

In some embodiments, the first dielectric trench structure, the second dielectric trench structure, the first slit structure, and the second slit structure extend parallel to each other in the first direction of the substrate.

In some embodiments, the semiconductor device includes a plurality of channel structures and a plurality of contact structures. The channel structures are formed over the substrate and further extend through the word line layers and the insulating layers in the array region of the stack. The contact structures are formed on the staircase regions, and connected to the word line layers in the staircase regions.

The semiconductor device further includes a plurality of dummy channel structures. The dummy channel structures are formed over the substrate and further extend through the word line layers and the insulating layers in the array region of the stack, where the first dielectric trench structure extends across a first set of the dummy channel structures, and the second dielectric trench structure extend across a second set of the dummy channel structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1A:
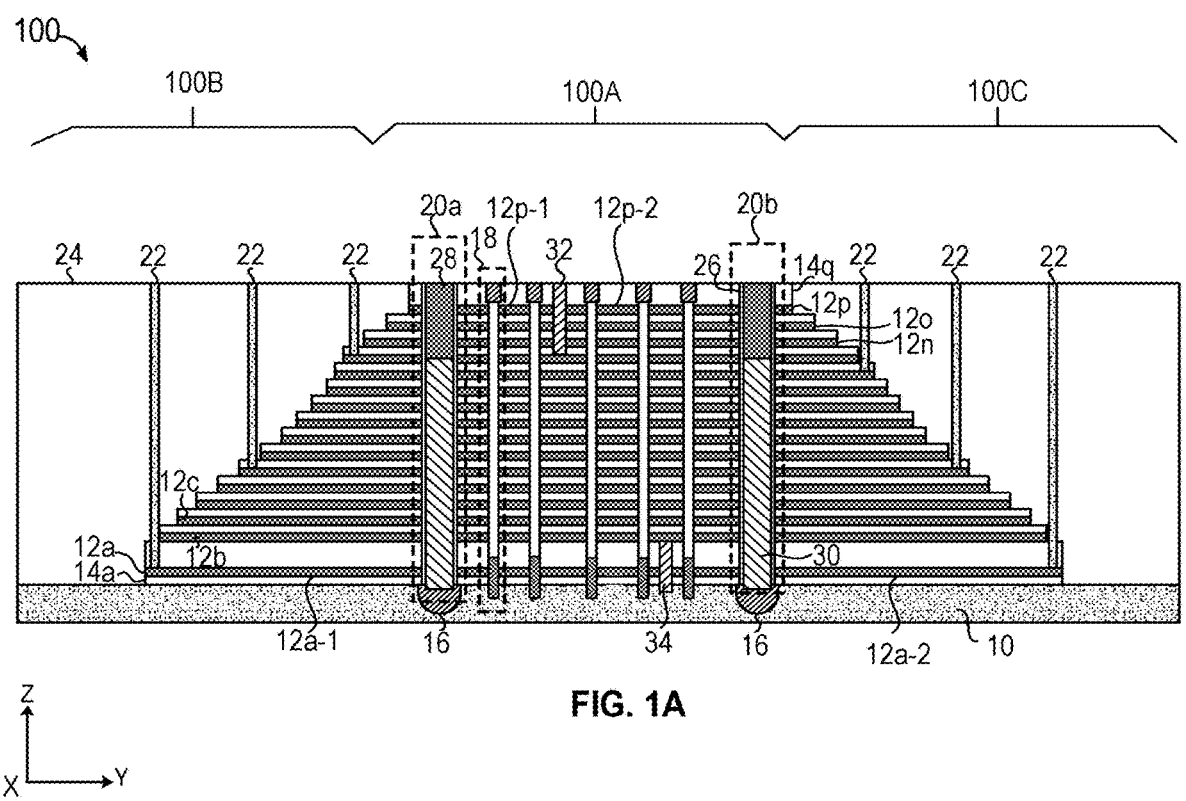
FIG. 1A is a cross-sectional view of an exemplary 3D-NAND memory device, in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The concepts relate to, for example, formation of a 3D-NAND memory device with divided block structures and each of the divided block structures can be operated (e.g., programmed, erased, or read) independently.

A 3D-NAND memory device can include a plurality of memory cell blocks (or blocks). Each of the blocks can include a plurality of vertical NAND memory cell strings. Each of the vertical NAND memory cell strings can have one or more bottom select transistors (BSTs), one or more dummy BSTs, a plurality of memory cells (MCs), one or more dummy top select transistors (TSTs), and one or more TSTs that are disposed sequentially and in series over a substrate along a height direction (or Z direction) of the substrate. A source region of a lowermost BST in each of the vertical NAND memory cell strings is connected to a common source line (CSL), and a drain region of an uppermost TST in each of the vertical NAND memory cell strings is connected to a respective bit line. In the 3D-NAND memory device, the vertical NAND memory cell strings of a same block can share one or more top select gates (TSGs). The shared one or more TSGs accordingly controls the TSTs of the vertical NAND memory cell strings in the same block simultaneously during operating the related 3D-NAND memory device, such as programming or reading the 3D-NAND memory device.

In the 3D-NAND memory device, the vertical NAND memory cell strings of the same block can share one or more bottom select gates (BSGs). The shared one or more BSGs accordingly controls the BSTs of the vertical NAND memory cell strings in the same block simultaneously during operating the 3D-NAND memory device, such as erasing the 3D-NAND memory device. As the 3D-NAND memory device migrates to higher capacities with increased block sizes, the shared one or more TSGs or BSGs can induce longer operation time, longer data transfer time, and lower storage efficiency.

In a related 3D-NAND memory device, a block can be separated into a plurality of sub-blocks by dividing the one or more shared TSGs into a plurality of sub-TSGs with one or more dielectric trench structures. The sub-blocks can be operated independently, so that the operation time and the data transfer time can be reduced accordingly. In a first example, one dielectric trench structure can be applied to separate the block into two sub-blocks. However, such a configuration can result in a low memory cell density. In a second example, two dielectric trench structures can be applied to separate the block into three sub-blocks. However, a sub-block between the two dielectric trench structures may not be functional because sacrificial word line layers in that sub-block may not be replaced with word line layers, for example as described below with respect to FIG. 3B.

In the disclosed 3D-NAND memory device, a block can have a first dielectric trench structure positioned in a bottom select gate (BSG) layer to separate the BSG layer into two portions, and a second dielectric trench structure positioned in a top select gate (TSG) layer to separate the TSG layer into two portions. The second dielectric trench structure is offset from the first dielectric trench structure. The disclosed configuration allows a higher channel structure density in the block by dividing the block into three independent and functional sub-blocks.

Figure 1B:
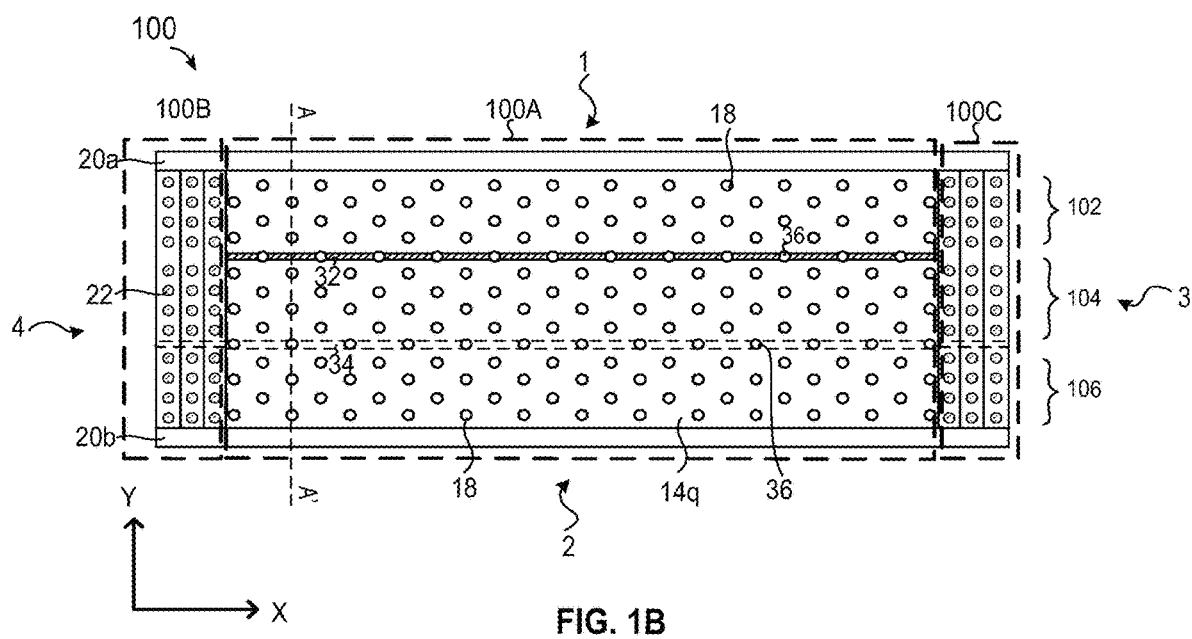
FIG. 1B is a top down view of an exemplary 3D-NAND memory device, in accordance with exemplary embodiments of the disclosure.
Figure 1C:
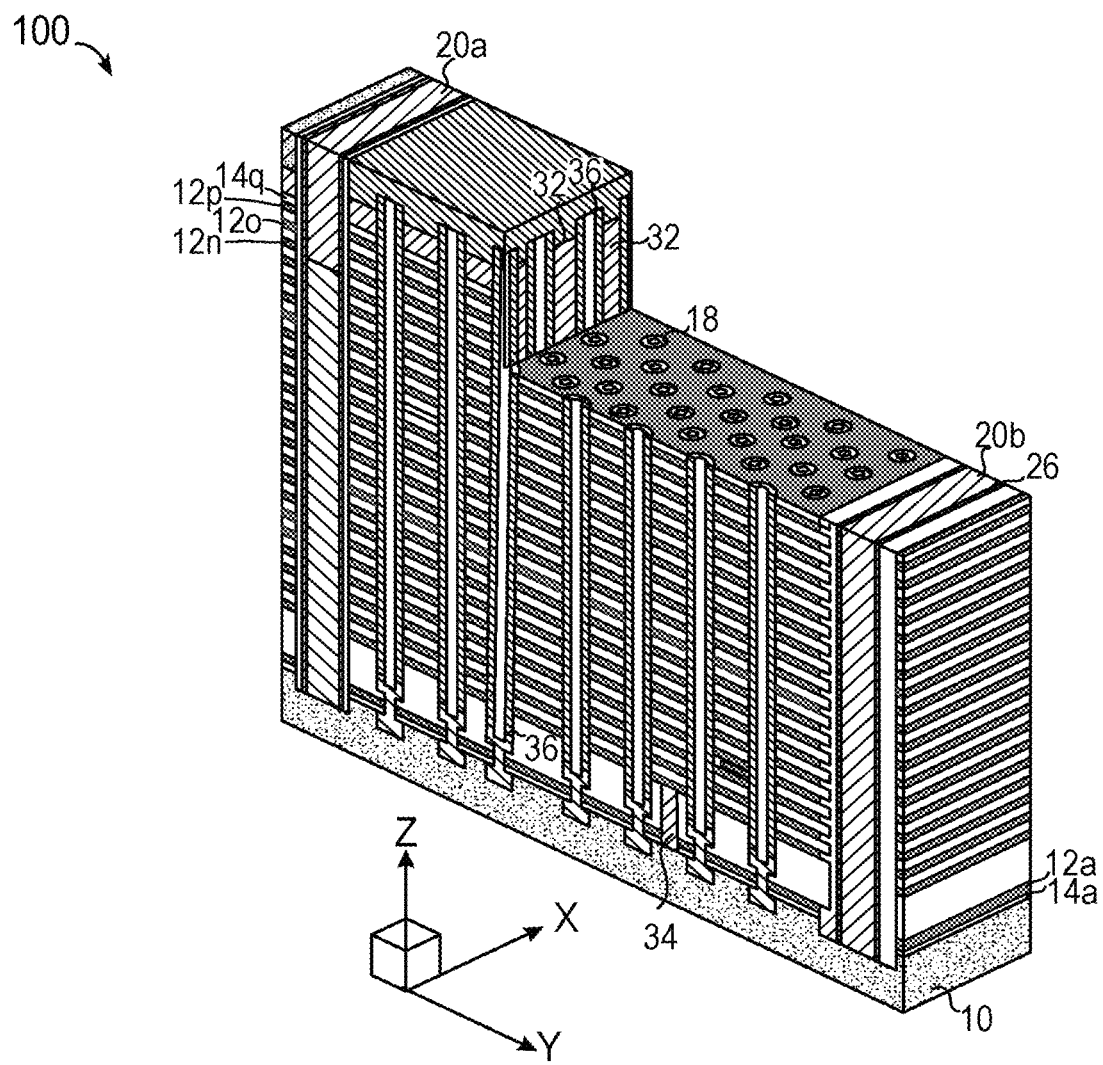
FIG. 1C is a three-dimensional view of an exemplary 3D-NAND memory device, in accordance with exemplary embodiments of the disclosure.

FIG. 1A is a cross-sectional view of an exemplary 3D-NAND memory device 100, and FIG. 1B is a top down view of the exemplary 3D-NAND memory device 100 where the cross-sectional view of the 3D-NAND memory device 100 in FIG. 1A is obtained from a line A-A' along a Z-direction (or a height direction) of a substrate in FIG. 1B. Dashed lines in FIG. 1B indicate a perspective view. FIG. 1C is a 3D view of the exemplary 3D-NAND memory device 100. For simplicity and clarity, only a block of the 3D-NAND memory device 100 is provided in FIGS. 1A, 1B and 1C.

As shown in FIG. 1A, the 3D-NAND memory device 100 can have a substrate 10. A plurality of word line layers and a plurality of insulating layers are stacked alternatingly over the substrate 10. In an exemplary embodiment of FIG. 1A, 16 word line layers and 17 insulating layers are included. However, FIG. 1A is merely an example, and any number of word line layers and insulating layers can be included based on the device structure. In some embodiments, a lowermost word line layer 12a can function as a bottom select gate (BSG) layer that is connected to a gate of a BST. In some embodiments, one or more of the word line layers over the BSG layer 12a, such as word line layer 12b-12c, can be dummy word line layers (or dummy BSG layers) that are connected to gates of dummy memory cells (dummy MCs). The BST and the dummy MCs together can control data transmission between array common source (ACS) regions 16 and the memory cells. In some embodiments, an uppermost word line layer 12p can function as a top select gate (TSG) layer that is connected to a gate of a TST. In some embodiments, one or more of the word line layers under the TSG layer 12p, such as word line layers 12n-12o, can be dummy word line layers (or dummy TSG layers) that are connected to gates of dummy memory cells (dummy MCs). The TST and the dummy MCs together control data transmission between bit lines (not shown) and the memory cells.

The insulating layers are positioned on the substrate 10 and arranged with the word line layers alternatingly. The word line layers are spaced part from one another by the insulating layers. In addition, the word line layers are separated from the substrate 10 by a lowermost insulating layer 14a of the insulating layers.

In some embodiments, the word line layers illustrated in FIG. 1A are formed first using sacrificial word line layers (e.g., SiN). The sacrificial word line layers can be removed and replaced with a high K layer, glue layers and one or more metal layers. The high K layer can be made of aluminum oxide ($Al_2O_3$) and/or Hafnium oxide ($HfO_2$) and/or Tantalum oxide ($Ta_2O_5$), and/or another material of high K (Dielectric Constant). The metal layer can be made of tungsten (W), Cobalt (Co), for example. The word lines can have a thickness in a range from 10 nm to 100 nm, according to requirements of product specification, device operation, manufacturing capabilities, and so on. In an embodiment of FIG. 1A, the insulating layers can be made of $SiO_2$ with a thickness from 5 nm to 50 nm.

In some embodiments, the 3D-NAND memory device 100 can have an array region 100A and two staircase regions 100B-100C. The staircase regions 100B-100C can be positioned at two sides of the array region 100A. The word line layers and the insulating layers can extend into the staircase region 100B-100C with a stair-cased profile or step-cased profile.

The 3D-NAND memory device 100 can include a plurality of channel structures 18 in the array region 100A. The channel structures 18 are formed over the substrate 10 along a Z-direction (or height direction) of the substrate. As shown in FIG. 1A, five channel structures 18 are included. However, FIG. 1A is merely an example, and any number of channel structures 18 can be included in the 3D-NAND memory device 100. The channel structures 18 can extend through the word line layers and the insulating layers, and further extend into the substrate 10 to form an array of vertical memory cell strings. Each of the vertical memory cell strings can include a corresponding channel structure that is coupled to the word line layers to form one or more bottom select transistors (BSTs), a plurality of memory cells (MCs), and one or more top select transistors (TSTs). The BSTs, MCs, and TSTs are disposed sequentially and in series over the substrate. In addition, each of the channel structures 18 can further include a channel layer, a tunneling layer, a charge trapping layer, and a barrier layer, which is shown in FIG. 3 in further detail.

The 3D-NAND memory device 100 can have a plurality of slit structures. For example, two slit structures 20a-20b are included in FIG. 1A. In some embodiments, a gate-last fabrication technology is used to form the 3D-NAND memory device 100, thus the slit structures are formed to assist in the removal of the sacrificial word line layers, and the formation of the real gates. In some embodiments, the slit structures can be made of conductive materials and positioned on array common source (ACS) regions 16 to serve as contacts, where the ACS regions are formed in the substrate 10 to serve as common sources. In some embodiments, the slit structures can be made of dielectric materials to serve as separation structures. In an exemplary embodiment of FIG. 1A, the slit structures 20a-20b are positioned at two opposing boundaries of the array region 100A and connected to the ACS regions 16.

In some embodiments, the slit structures 20a-20b can extend through the word line layers and the insulating layers, and further extend along a first direction (also referred to as a length direction, or a X direction) of the substrate 10. In some embodiments, the slit structures 20a-20b can have a dielectric spacer 26, a conductive layer 30, and a contact 28. The dielectric spacer 26 is formed along sidewalls of the slit statures and in direct contact with the word line layers and the insulating layers. The conductive layer 30 is formed along the dielectric spacer 26 and over the ACS regions 16. The contact 28 is formed along the dielectric spacer 26 and over the conductive layer 30. In an embodiment of FIG. 1A, the dielectric spacer 26 is made of $SiO_2$, the conductive layer 30 is made of polysilicon, and the contact 28 is made of tungsten.

The 3D-NAND memory device 100 can have a plurality of contact structures 22. The contact structures 22 are formed in a dielectric layer 24 and positioned on the word line layers to connect to the word line layers. For simplicity and clarity, only three contact structures 22 are illustrated in each of the staircase regions 100B and 100C. The contact structures 22 can further be coupled to gate voltages. The gate voltages can be applied to gates of the BSTs, the MCs, and the TSTs through the word line layers to operate the BSTs, the MCs, and the TSTs correspondingly.

The 3D-NAND memory device 100 can have a first dielectric trench structure 34 that extends in the first direction of the substrate 10. In some embodiments, the first dielectric trench structure 34 can be positioned in the BSG layer 12a to separate the BSG layer 12a into two portions (or sub-BSG layers) 12a-1 and 12a-2. In some embodiments, the first dielectric trench structure 34 can further extend through one or more dummy word line layers, such as 12b-12c, to separate the dummy word line layers into two portions (or sub-dummy word line layers) according to the device design. In an exemplary embodiment of FIG. 1A, the first dielectric trench structure 34 is only positioned in the BSG layer 12a to separate the BSG layer 12a into two sub-BSG layers 12a-1 and 12a-2.

Still referring to FIG. 1A, a second dielectric trench structure 32 is positioned in the top select gate (TSG) layer 12p and the dummy word line layers 12n-12o to separate the TSG layer 12p and the dummy word line layers 12n-12o into two portions. For example, the TSG layer 12p becomes 12p-1 and 12p-2 when the second dielectric trench structure 32 is introduced. The second dielectric trench structure 32 extends in the first direction of the substrate 10. Accordingly, the TSG layer 12p and the dummy word line layers 12n-12o are divided into two sub-TSG layers and two sub-dummy word line layers along the first direction of the substrate. It should be noted that FIG. 1A is merely an example, and the second dielectric trench structure 32 can separate any number of word line layers at a top portion of the 3D-NAND memory device 100.

The first dielectric trench structure 34 is offset from the second dielectric trench structure 32 in a second direction (also referred to as a width direction, or a Y direction) of the substrate 10 that is perpendicular to the first direction. The first dielectric trench structure 34 is also spaced apart from the second dielectric trench structure 32 by one or more word line layers and the insulating layers along the Z direction (or height direction) of the substrate 10.

In some embodiments, the first and second dielectric trench structures 34 and 32 can have a critical dimension (CD) from 50 nm to 150 nm. In some embodiments, the first and second dielectric trench structures 34 and 32 can be empty structures. In some embodiments, the first and second dielectric trench structures 34 and 32 can be filled with SiN, $SiO_2$, SiON, SiOCN, SiCN, or other suitable dielectric materials. In some embodiments, the first and second dielectric trench structures 34 and 32 can extend along the first direction of the substrate 10 with a depth between 10 nm and 100 nm. In some embodiments, the first dielectric trench structure 34 and the second dielectric trench structure 32 are disposed between the slit structures 20a-20b in the second direction of the substrate 10. In some embodiments, the first dielectric trench structure 34, the second dielectric trench structure 32, and the slit structures 20a-20b extend parallel to each other in the first direction of the substrate 10.

By introducing the first and second dielectric trench structures 34 and 32 into the 3D-NAND memory device 100, the BSG layer and the TSG layer can be separated into a plurality of sub-BSG layers and sub-TSG layers. The sub-BSG layers and the sub-TSG layers can divide the 3D-NAND memory device 100 into a plurality of sub-blocks. Each of the sub-blocks can have a respective sub-BSG layer and a respective sub-TSG layer. Accordingly, each of the sub-blocks can be operated independently through controlling the respective sub-BSG layer and the respective sub-TSG layer. Correspondingly, the 3D-NAND memory device 100 can precisely control a desired sub-block (or sub-array region) so as to effectively reduce a programming time, a reading time, an erasing time, and a data transfer time, and significantly improve data storage efficiency.

FIG. 1B is a top down view of the 3D-NAND memory device 100 in accordance with some embodiments of the disclosure. As shown in FIG. 1B, the 3D-NAND memory device 100 can have four boundaries 1-4. The two slit structures 20a-20b are positioned at a first boundary 1 and a second boundary 2 respectively, and further extend along the first direction (or length direction) of the substrate 10. The slit structure 20a is disposed at first boundaries (or top boundaries) of the array region 100A and the staircase regions 100B-100C. The slit structure 20b is disposed at second boundaries (or bottom boundaries) of the array region 100A and the staircase regions 100B-100C. The second boundaries are opposite to the first boundaries according to some embodiments. The slit structures 20a-20b can serve as contacts to connect the ACS regions 16 of the 3D-NAND memory device 100, and further isolate the 3D-NAND memory device 100 from adjacent components.

Still referring to FIG. 1B, the first dielectric trench structure 34 and the second dielectric trench structure 32 are disposed between the slit structures 20a-20b in the second direction of the substrate 10. The first dielectric trench structure 34, the second dielectric trench structure 32, and the slit structures 20a-20b extend parallel to each other in the first direction of the substrate 10. In some embodiments, the first and second dielectric trench structures 34 and 32 are intentionally offset from each other along the second direction (width direction) of the substrate 10.

Several benefits can be obtained by introducing a misaligned profile between the first and second dielectric trench structures 34 and 32. First, the first dielectric trench structure 34 and the second dielectric trench structure 32 can divide the 3D-NAND memory device 100 into three sub-blocks 102, 104, and 106. The three sub-blocks 102, 104, and 106 can be operated independently by applying appropriate control voltages on the sub-BSG layers 12a-1 and 12a-2, and the sub-TSG layers 12p-1 and 12p-2. In an example, in order to program the sub-block 102, the sub-TSG layer 12p-1 can be applied with a Vcc voltage, such as 1.0 volt, and the sub-BSG layer 12a-1 can be applied with a zero voltage. In another example, in order to erase the sub-block 104, the sub-TSG layer 12p-2 can be at a floating stage, and the sub-BSG layer 12a-1 can be switched from a ground stage (e.g., zero volt) to a floating stage.

Second, the misaligned profile between the first and second dielectric trench structures 34 and 32 allows the sacrificial word line layers in every sub-block to be replaced with word line layers. During the replacement of the sacrificial word line layers into the word line layers, a wet etching chemical can be introduced from the slit structures, and flow toward the first and second dielectric trench structures 34 and 32. The wet etching chemical has a good etching selectivity between the sacrificial word line layers and the insulating layers. Consequently, the sacrificial word line layers can be removed to form empty spaces and the insulating layers still remain. A deposition process can be subsequently introduced to fill the empty spaces to form the word line layers.

The 3D-NAND memory device 100 can further include a plurality of dummy channel structures 36 that are formed over the substrate and extend through the word line layers and the insulating layers along the Z direction (or height direction) of the substrate. In some embodiments, the dummy channel structures are formed in the staircase regions 100B and 100C only. In some embodiments, the dummy channel structures 36 can be formed in both the staircase regions 100B and 100C and the array region 100A. The dummy channel structures serve as sustain components to support the staircase regions and/or the array regions when the sacrificial word lines are removed. In an embodiment of FIG. 1B, the dummy channel structures 36 are formed in the array region 100A. In some embodiments, the dummy channel structures 36 can be formed with the channel structures 18 together and have a similar structure to the channel structures 18. Thus, the dummy structures can also include a barrier layer, a trapping layer, a tunneling layer, and a channel layer. In some embodiments, the dummy channel structures 36 have a different structure to the channel structures 18. For example, the dummy channel structures 36 are made of a dielectric material, such as SiO, SiN, or other suitable dielectric materials.

As shown in FIG. 1B, the channel structures 18 are formed over the substrate 10 and further extend through the word line layers and the insulating layers. The channel structures 18 are disposed between the slit structures 20a-20b. The dummy channel structures 36 are also disposed between the first slit structure and the second slit structure. In some embodiments, the first dielectric trench structure 34 extends across a first set of the dummy channel structures, and the second dielectric trench structure 32 extends across a second set of the dummy channel structures. Further, the contact structures 22 are positioned on the word line layers in the staircase regions 100B and 100C. It should be understood that FIG. 1B is merely an example. The 3D-NAND memory device 100 can include any number of channel structures 18, any number of contact structures 22, and any number of dummy channel structures 36.

Figure 2:
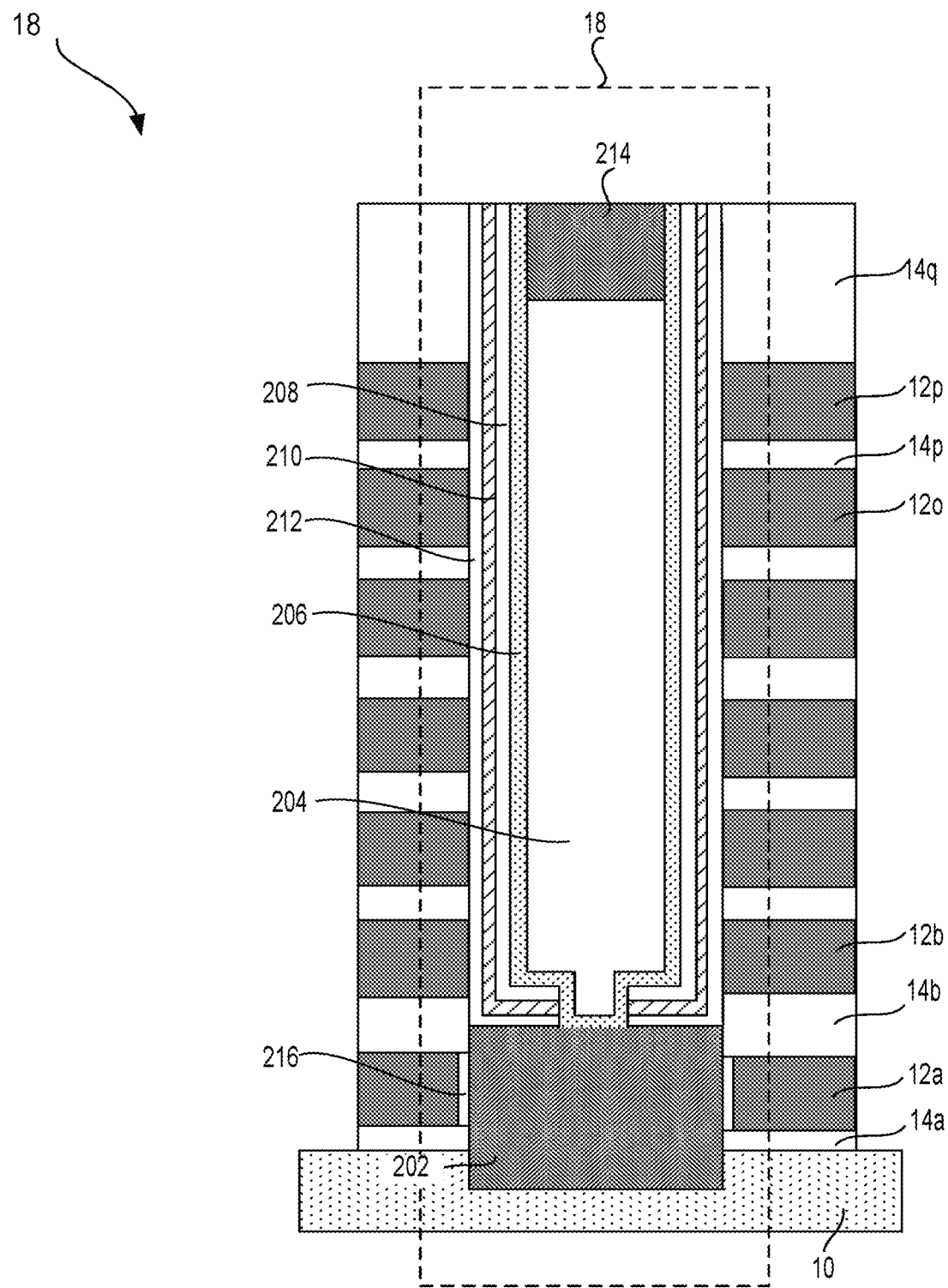
FIG. 2 is a cross-sectional view of a channel structure in an exemplary 3D-NAND memory device, in accordance with exemplary embodiments of the disclosure.

FIG. 1C is a three-dimensional view of the 3D-NAND memory device 100, in accordance with exemplary embodiments of the disclosure. As shown in FIG. 2, the word line layers and the insulating layers are stacked alternatingly over the substrate 10. The second dielectric trench structure 32 is positioned in the top select gate (TSG) layer 12p and the dummy word line layers 12n-12o of the word line layers to separate the TSG layer 12p and dummy word line layers 12n-12o into two portions. The second dielectric trench structure 32 further extends in the first direction (or X direction) of substrate 10. The first dielectric trench structure 34 is positioned in the bottom select gate (BSG) layer 12a of the word line layers to separate the BSG layer 12a into two portions and extends in the first direction of the substrate 10. The first dielectric trench structure 34 is offset from the second dielectric trench structure 32 in the second direction (or Y direction) of the substrate 10.

FIG. 2 is a cross-sectional view of the channel structure 18 in the 3D-NAND memory device 100. As shown in FIG. 2, the channel structure 18 can have a cylindrical shape with sidewalls and a bottom region. Of course, other shapes are possible. The channel structure 18 is formed along the Z-direction perpendicular to the substrate 10, and electrically coupled with the substrate 10 via a bottom channel contact 202 that is positioned at the bottom region of the channel structure. The channel structure 18 further includes a channel layer 206, a tunneling layer 208, a charge trapping layer 210, and a barrier layer 212. The barrier layer 212 is formed along the sidewalls of the channel structure 18 and over the bottom channel contact 202. The barrier layer 212 is in direct contact with the word lines and the insulating layers. The charge trapping layer 210 is formed along the barrier layer 212 and over the bottom channel contact 202, and the tunneling layer 208 is formed along the charge trapping layer 210 and over the bottom channel contact 202. The channel layer 206 has side portions that are formed along the tunneling layer 208 and has a T-shaped bottom portion that extends through bottom portions of the tunneling layer 208, the charge trapping layer 210, and the barrier layer 212 that are positioned over the bottom channel contact 202. The T-shaped bottom portion of the channel layer 206 further is positioned over the bottom channel contact 202 and is in direct contact with the bottom channel contact 202. In addition, the tunneling layer 208, the charge trapping layer 210, and the barrier layer 212 can form an "L-foot" configuration in the channel structure 18. The L-foot configuration can include side portions that are formed along the sidewalls of the channel structure 18 and a bottom portion over the bottom channel contact 202.

The channel structure 18 can also have a channel insulating layer 204 that is formed along the channel layer 206 to fill the channel structure 18. The channel insulating layer 204 can have a T-shaped bottom portion that extends through bottom portions of the channel layer 206, the tunneling layer 208, the charge trapping layer 210, and the barrier layer 212 and lands on the channel layer 206. In some embodiments, the channel insulating layer 204 can include a void that is positioned in a middle position of the channel insulating layer 204. The channel structure 18 can further include a top channel contact 214 that is formed along the channel insulating layer 204 and in direct contact with the channel layer 206. The top channel contact 214 is positioned above the TSG layer 12p to prevent any electrical interference between the top channel contact 214 and the TSG layer 12p. In the channel structure 18, a gate dielectric layer 216 is further formed between the BSG layer 12a and the bottom channel contact 202. The gate dielectric layer 216 can be positioned between the insulating layer 14b and 14a, and have an annular shape to surround the bottom channel contact 202.

In an embodiment of FIG. 2, the barrier layer 212 is made of $SiO_2$. In another embodiment, the barrier layer 212 can include multiple layers, such as $SiO_2$ and $Al_2O_3$. In an embodiment of FIG. 2, the charge trapping layer 210 is made of SiN. In another embodiment, the charge trapping layer 210 can include a multi-layer configuration, such as a SiN/SiON/SiN multi-layer configuration. In some embodiments, the tunneling layer 208 can include a multi-layer configuration, such as a SiO/SiON/SiO multi-layer configuration. In an embodiment of FIG. 2, the channel layer 206 is made of polysilicon via a furnace low pressure chemical vapor deposition (CVD) process. The channel insulating layer 204 can be made of $SiO_2$, and the top and bottom channel contacts 214 and 202 can be made of polysilicon.

As shown in FIG. 2, the channel structure 18 can have a cylindrical shape. However, the present disclosure is not limited thereto, and the channel structures 18 may be formed in other shapes, such as a square pillar-shape, an oval pillar-shape, or any other suitable shapes.

Figure 3A:
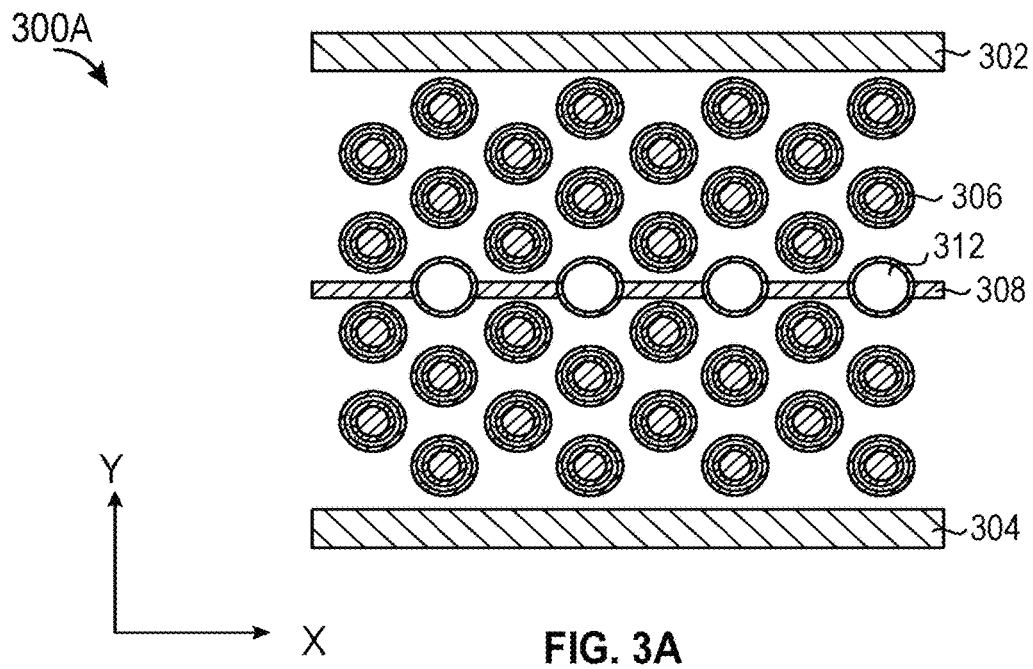
FIG. 3A is a top down view of a first 3D-NAND memory device.

FIG. 3A is a top down view of a first related 3D-NAND memory device 300A. For simplicity and clarity, only a block of the 3D-NAND memory device 300A is illustrated in FIG. 3A. As shown in FIG. 3A, the 3D-NAND memory device 300A has a first slit structure 302 positioned at a first boundary of the 3D-NAND memory device 300A, and a second slit structure 304 positioned at an opposing second boundary of the 3D-NAND memory device 300A. The first and second slit structures 302 and 304 extend in a length (or X) direction of the 3D-NAND memory device 300A. A plurality of channel structures 306 is disposed between the first and second slit structures 302 and 304. A plurality of dummy channel structures 312 is disposed between the first and second slit structures. The dummy channel structures 312 can have a same structure to the channel structures 306 or a different structure to the channel structures 306. A dielectric trench structure 308 is positioned in the 3D-NAND memory device 300A and extends in the length direction of the 3D-NAND memory device 300A. The dielectric trench structure 308 separates a TSG layer of the 3D-NAND memory device 300A into two sub-TSG layers, which in turn divides the 3D-NAND memory device 300A into two sub-blocks. The dielectric trench structure 308 further extends across a set of dummy channel structures 312. Limitations of the 3D-NAND memory device 300A are a high block pitch and a low channel structure density.

Figure 3B:
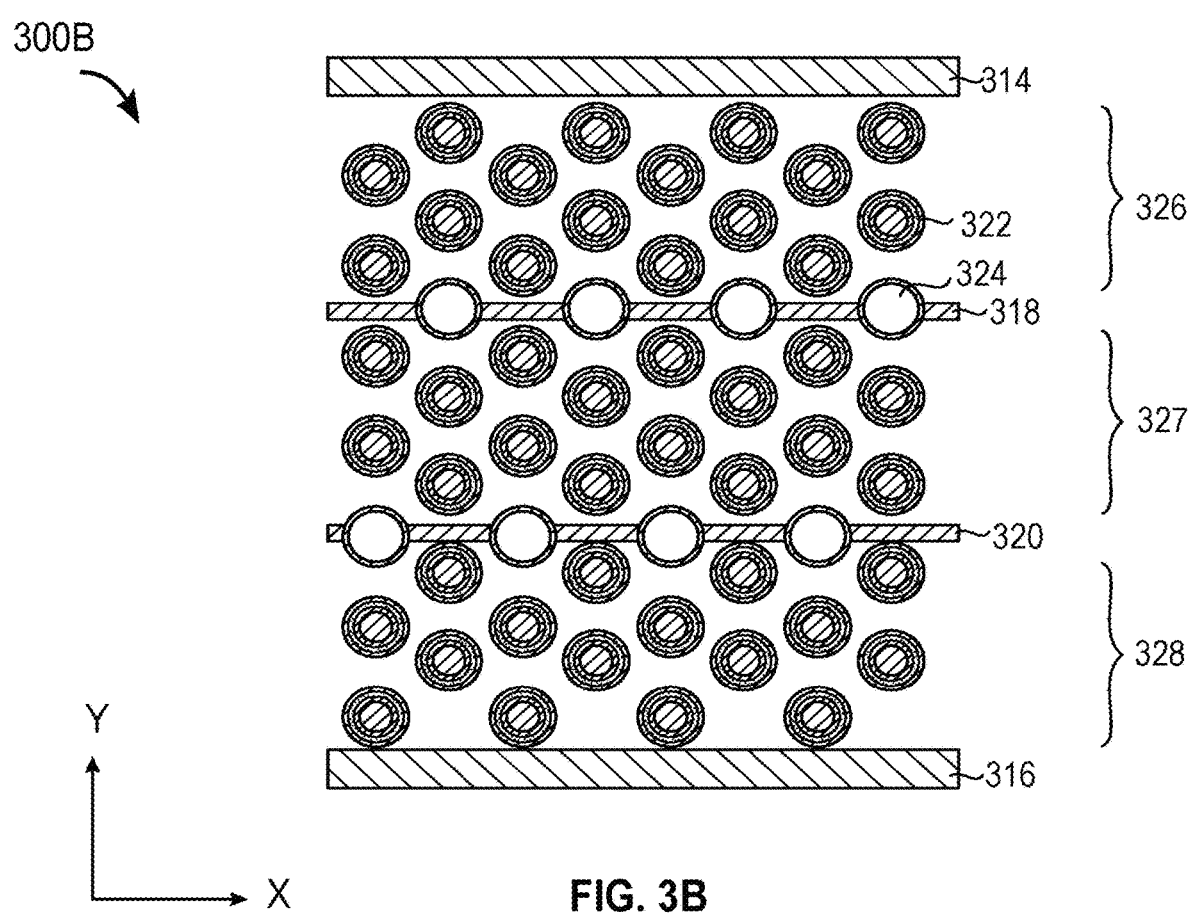
FIG. 3B is a top down view of a second 3D-NAND memory device.

FIG. 3B is a top down view of a second related 3D-NAND memory device 300B. For simplicity and clarity, only a block of the 3D-NAND memory device 300B is illustrated in FIG. 3B. The memory device 300B has a first slit structure 314 positioned at a first boundary of the 3D-NAND memory device 300B, and a second slit structure 316 positioned at a second boundary of the 3D-NAND memory device 300B. The first and second slit structures 314 and 316 extend in a length (or X) direction of the 3D-NAND memory device 300B. A plurality of channel structures 322 is disposed between the first and second slit structures 314 and 316. A plurality of dummy channel structures 324 is disposed between the first and second slit structures 314 and 316. The dummy channel structures 324 can have a same structure to the channel structures 322 or a different structure to the channel structures 322. A first dielectric trench structure 318 and a second dielectric trench structure 320 are positioned in the 3D-NAND memory device 300B and extend in the length direction of 3D-NAND memory device 300B. The first and second dielectric trench structures 318 and 320 separate a TSG layer of the 3D-NAND memory device 300B into three sub-TSG layers, which in turn divides the 3D-NAND memory device 300B into three sub-blocks 326-328. The 3D-NAND memory device 300B can have a larger channel structure density than the 3D-NAND memory device 300A. However, sacrificial word line layers disposed between the first and second dielectric trench structures 318 and 320 in the sub-block 327 may not be able to be removed by an etching process because the first and second dielectric trench structures 318 and 320 can block an etching chemical from the etching process. Accordingly, the sub-block 327 may not be functional.

FIGS. 4A, 4B, 5, 6, 7A, 7B, 8A, 8B, 9A, 9B, and 10 are cross-sectional and top down views of various intermediate steps of manufacturing the 3D-NAND memory device 100 in accordance with exemplary embodiments of the disclosure.

Figure 4A:
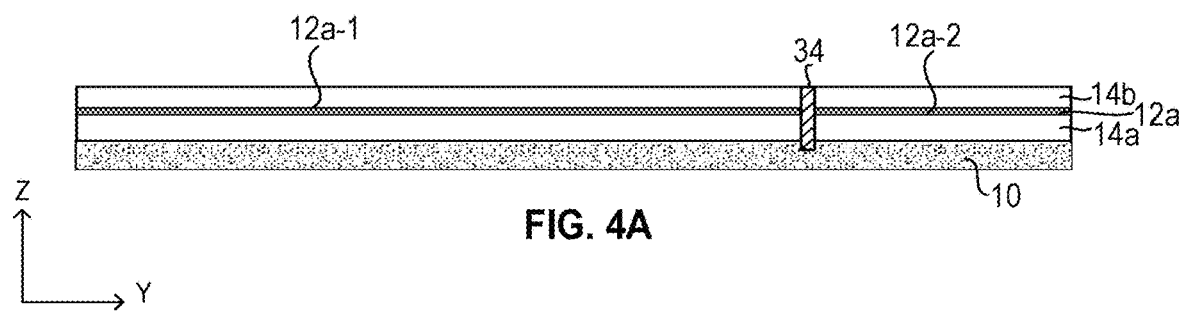
FIGS. 4A, 4B, 5, 6, 7A, 7B, 8A, 8B, 9A, 9B, and 10 are cross-sectional and top down views of various intermediate steps of manufacturing an exemplary 3D-NAND memory device, in accordance with exemplary embodiments of the disclosure.
Figure 4B:
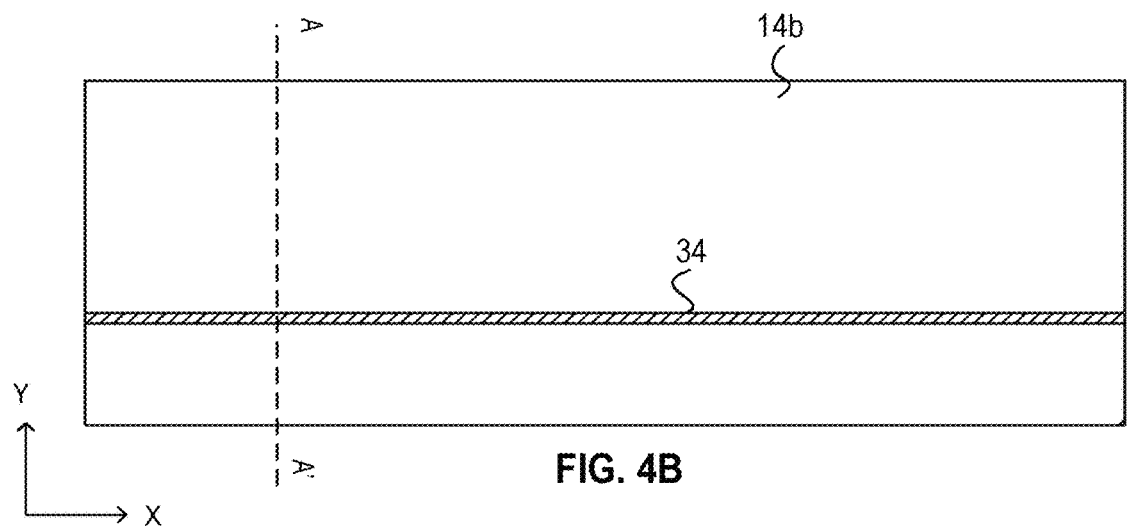

FIGS. 4A and 4B illustrate formation of a first dielectric trench structure 34. FIG. 4A is a cross-sectional view of a substrate 10 and FIG. 4B is a top down view of the substrate 10, where the cross-sectional view in FIG. 4A is obtained from a line A-A' along a Z-direction (or height direction) of the substrate 10 in FIG. 4B. As shown in FIG. 4A, one or more bottom select gate (BSG) layers and a plurality of first insulating layers can be formed and positioned alternatingly over the substrate 10. In an exemplary embodiment of FIG. 4A, a BSG layer 12a and two first insulating layers 14a-14b are formed over the substrate 10. Thus, the lowermost first insulating layer 14a is formed on the substrate 10, and the BSG layer 12a is arranged between the first insulating layers 14a-14b.

The BSG layer 12a can be a dummy BSG layer that is made of SiN. The dummy BSG layer can be removed and replaced with a high K layer and a metal layer in subsequent manufacturing steps. The BSG layer 12a can have a thickness in a range from 10 nm to 100 nm. The first insulating layers can include SiO, SiCN, SiOCN, or other suitable materials. The first insulating layers 14a-14b can have a thickness from 5 nm to 50 nm. Any suitable deposition process can be applied to form the BSG layer, the first insulating layers, such as chemical vapor deposition (CVD), physical vapor deposition (PVD), atomic layer deposition (ALD), diffusion, or any combination thereof.

Still referring to FIG. 4A, a first dielectric trench structure 34 can be formed in the BSG layer 12a to separate the BSG layer 12a into two portions (or sub-BSG layers) 12a-1 and 12a-2. The first dielectric trench structure 34 extends in a first direction (also referred to as a length direction or an X direction) of the substrate 10. Although the first dielectric trench structure 34 is illustrated as being formed in the lowermost BSG layer, the first dielectric trench structure 34 can be formed in another BSG layer in other embodiments. The first dielectric trench structure 34 can have a CD from 50 nm to 150 nm. The first dielectric trench structure 34 can be made of SiCN, SiO 2, SiON, SiOCN, SiN, or other suitable dielectric materials. In some embodiments, the first dielectric trench structure 34 can extend into the substrate 10 with a depth between 10 nm and 100 nm. In order to form the first dielectric trench structure 34, a patterned mask stack can be formed over the first insulating layer 14b by a photolithography process. An etching processing subsequently can be introduced to etch through the first insulating layers, the BSG layer, and further extend into the substrate 10 to form a trench opening (not shown). The trench opening then can be filled with a dielectric material, such as $SiO_2$, SiON, SiOCN, SiN, SiCN, or other suitable materials by applying CVD, PVD, ALD, a diffusion, or any combination thereof. A surface planarization process, such as a Chemical Mechanical Polish (CMP) process, may be performed to remove any excess dielectric materials over the first insulating layer 14b. The dielectric material that remains in the trench opening becomes the first dielectric trench structure 34. In some embodiments, once the trench opening is formed, the trench opening can remain empty and become the first dielectric trench structure 34. Accordingly, the first dielectric trench structure 34 can be an empty structure.

Figure 5:
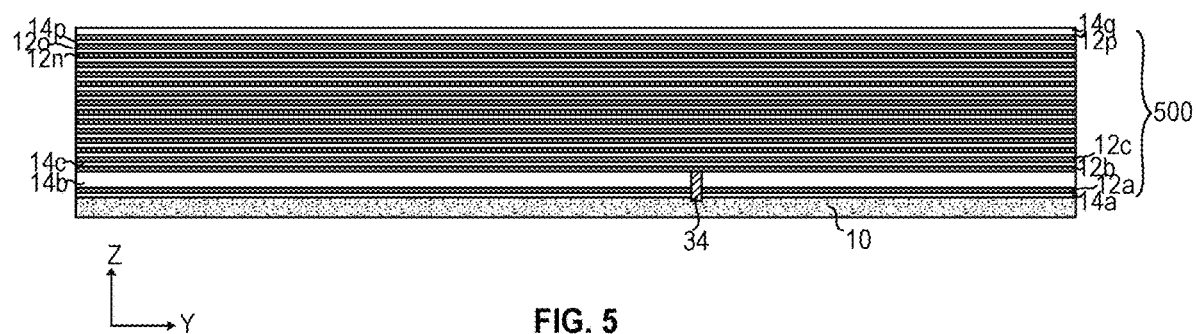

In FIG. 5, a plurality of word line layers and a plurality of second insulating layers are deposited over the first insulating layer 14b. The word line layers, the second insulating layers, the first insulating layers 14a-14b, and the BSG layer 12a accordingly form a stack 500. The word line layers and the second insulating layers are positioned alternatingly so that the word line layers are spaced apart from each other by the second insulating layers. For example, as shown in FIG. 5, a word line layer 12b is positioned over the first insulating layer 14b, and the second insulating layer 14c is positioned over the word line layer 12b. An uppermost word line layer 12p is positioned between an uppermost second insulating layer 14q and a second insulating layer 14p. In some embodiments, the uppermost word line layer 12p of the word line layers can function as a TSG layer. In other embodiments, the TSG layer can be a word line layer other than the uppermost word line layer 12p, such as a word line layer 12n or a word line layer 12o that is positioned below the word line layer 12p. In some embodiments, the word line layer 12p functions as the TSG layer, and the word line layers 12n-12o can be dummy word line layers. In yet other embodiments, one or more of the word line layers over the BSG layer 12a, such as word line layer 12b-12c, can be dummy word line layers.

The word line layers can also be sacrificial layers that are made of SiN and have a thickness in a range from 10 nm to 100 nm. The sacrificial layers can be removed and replaced with a high K layer and a metal layer in the subsequent manufacturing steps. The second insulating layers can have a thickness between 5 nm and 50 nm, and include $SiO_2$, SiCN, SiOCN, or other suitable materials. Any suitable deposition process can be applied to form the word line layers and the second insulating layers, such as CVD, PVD, ALD, diffusion, or any combination thereof.

Figure 6:
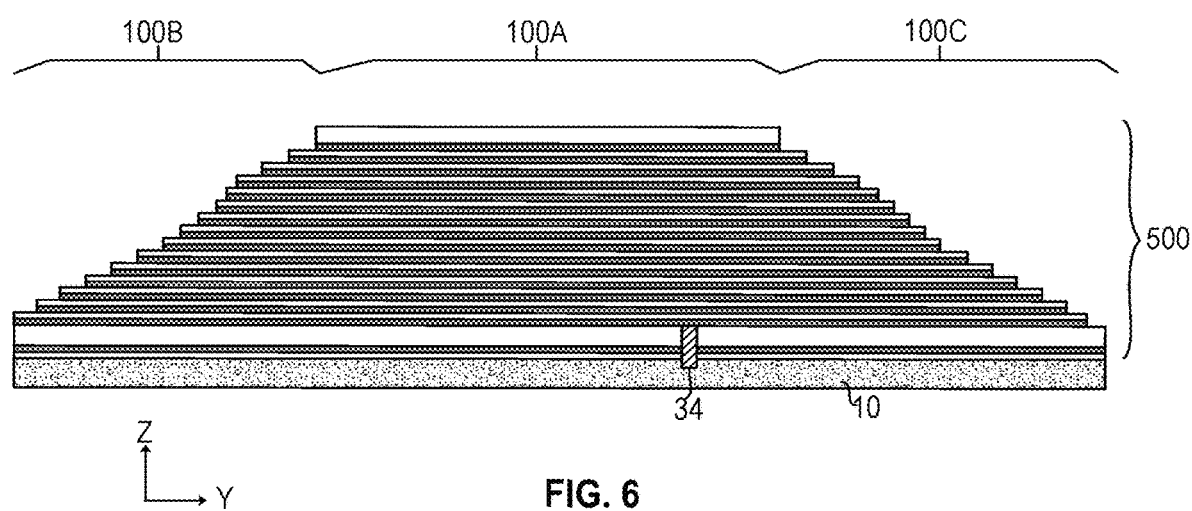

In FIG. 6, two staircase regions 100B and 100C are formed in the stack 500. The formation of the two staircase regions 100B and 100C can be formed by a trim-etch process. The trim-etch process can be applied on the second insulating layers, the word line layers, the BSG layer 12a, and the first insulating layers 14a-14b to form the two staircase regions 100B and 100C. Once the staircase regions 100B and 100C are formed, an array region 100A is positioned between the staircase regions 100B and 100C.

Figure 7A:
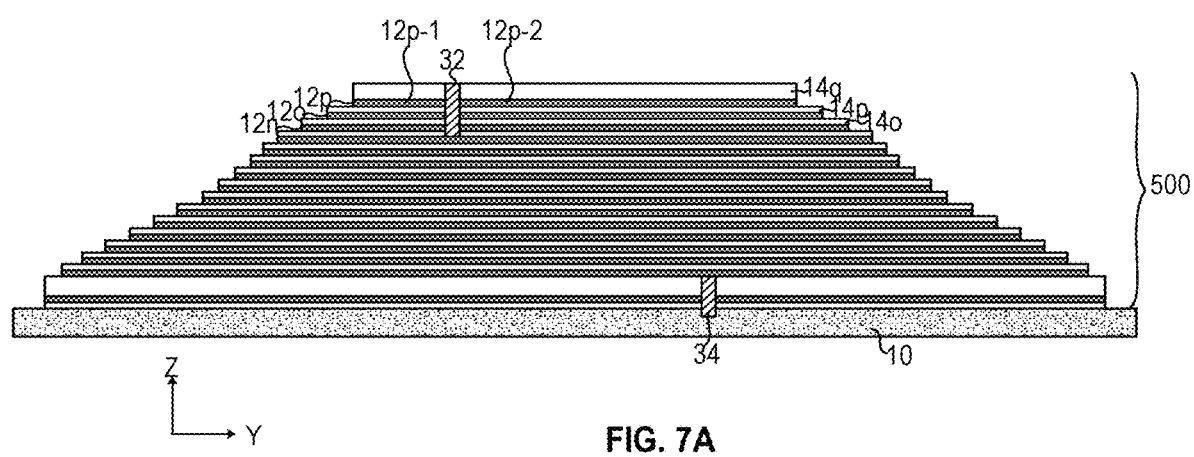
Figure 7B:
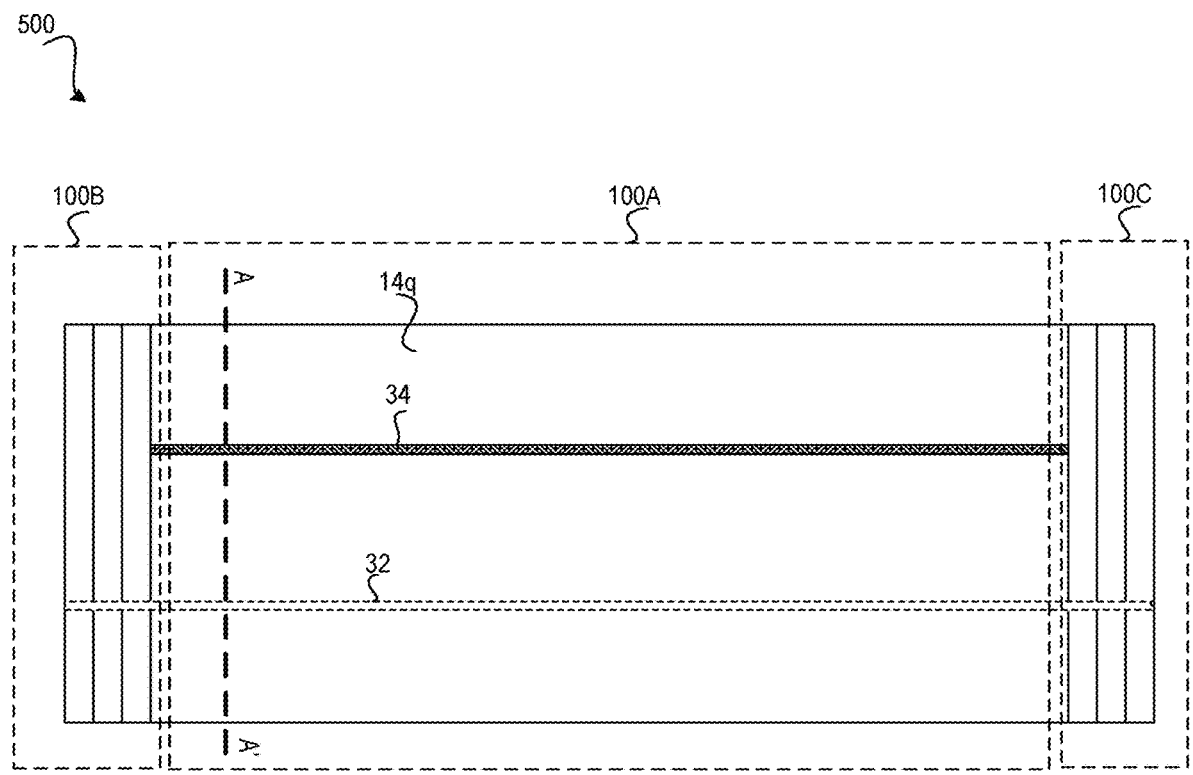

FIGS. 7A and 7B illustrate formation of a second dielectric trench structure 32 in the stack 500. FIG. 7A is a cross-sectional view of a substrate 10 and FIG. 7B is a top down view of the substrate 10, where the cross-sectional view in FIG. 7A is obtained from a line A-A' along the Z-direction (or height direction) of the substrate 10 in FIG. 7B. As shown in FIG. 7A, the second dielectric trench structure 32 can be formed in the word line layers 12n-12p. In some embodiments, the word line layer 12p can be a TSG layer of the 3D-NAND memory device 100, and the word line layers 12n-12o can be two dummy word line layers. The second dielectric trench structure 32 extends in the first direction of the substrate 10 to separate the TSG layer 12p and the dummy word line layers 12n-12o into two portions. For example, two sub-TSG layers 12p-1 and 12p-2 can be formed in FIG. 7A. In some embodiments, the second dielectric trench structure 32 can be offset from the first dielectric trench structure 34 in a second direction (also referred to as a width direction, or a Y direction) of the substrate 10. In some embodiments, the second dielectric trench structure 32 can have a CD from 50 nm to 150 nm and include $SiO_2$, SiON, SiOCN, SiN, SiCN, or other suitable dielectric materials. In some embodiments, the second dielectric trench structure 32 can be an empty structure. The second dielectric trench structure 32 can be formed based on a similar process mentioned above to form the first dielectric trench structure 34.

It should be noted that FIGS. 7A and 7B are merely examples, the first dielectric trench structure 34 can further extend along the Z-direction so as to be positioned in any number of the word line layers above the BSG layer 12a. The second dielectric trench structure 32 can further extend toward the substrate so as to be positioned in any number of the word line layers below the word line layer 12n, according to the device structure.

Figure 8A:
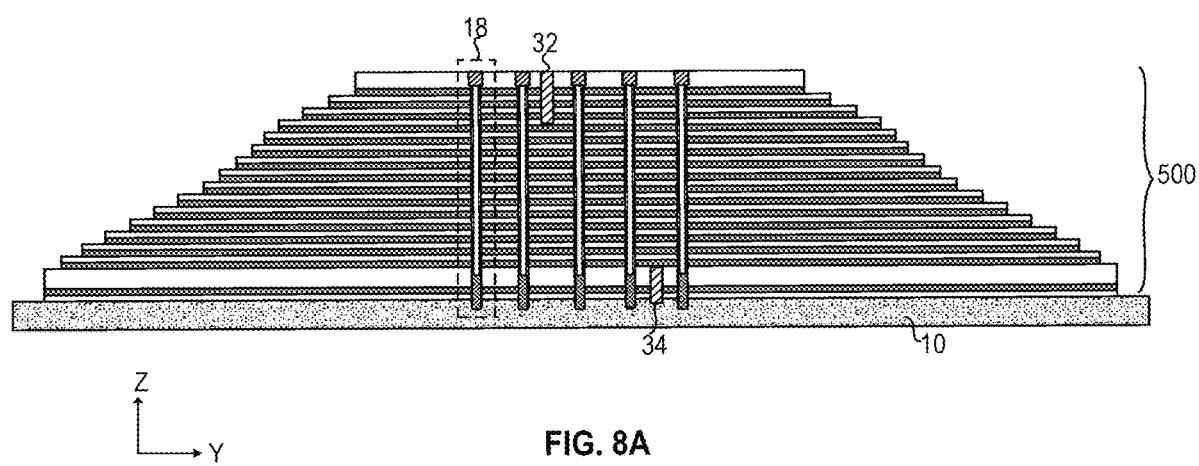
Figure 8B:
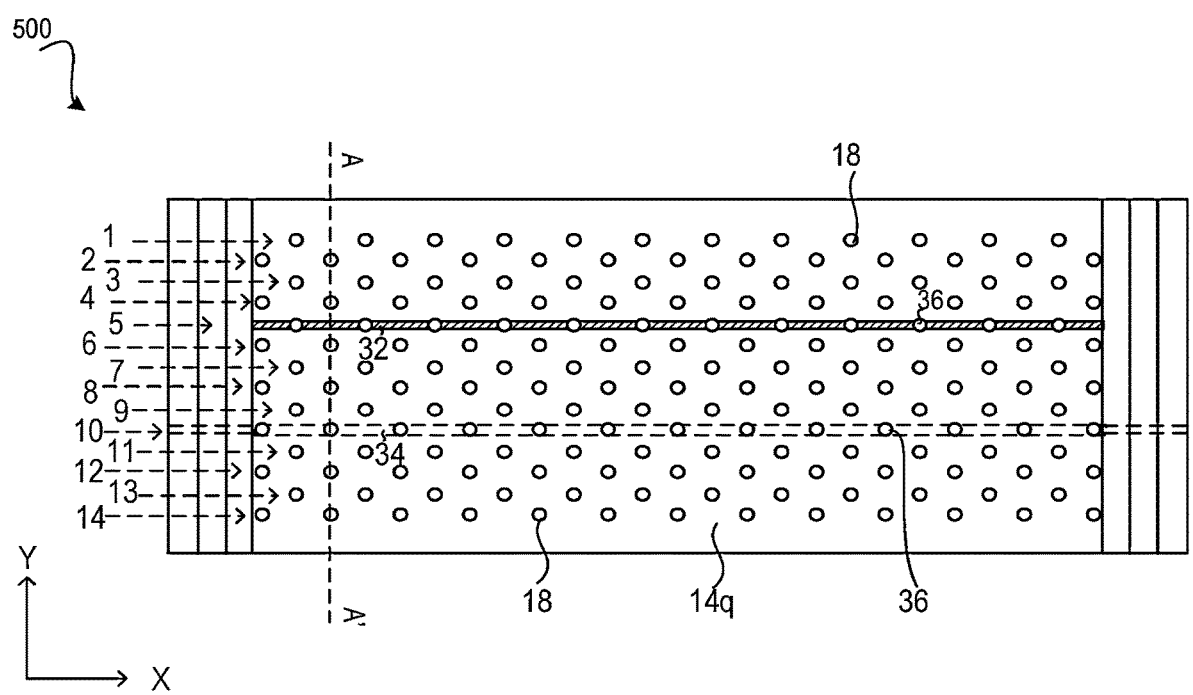

FIGS. 8A and 8B illustrate formation of channel structures 18 and dummy channel structures 36 in the stack 500. FIG. 8A is a cross-sectional view of a substrate 10 and FIG. 8B is a top down view of the substrate 10, where the cross-sectional view in FIG. 8A is obtained from a line A-A' along the Z-direction (or height direction) of the substrate 10 in FIG. 8B. In order to form the channel structures 18, a plurality of channel openings can be formed first. The channel openings can be formed through a photolithography process to form a patterned mask and a subsequent etching process to transfer the patterns of the mask. The formed channel openings can pass through the word line layers, the BSG layer 12a, and the first and second insulating layers, and further extend into the substrate 10. Each of the channel openings can have side portions and a bottom portion to expose the substrate 10. When the channel openings are formed, a plurality of bottom channel contacts, such as the bottom channel contact 202 illustrated in FIG. 2, can be formed at the bottom portions of the channel openings. Each of the channel openings can have a respective bottom contact at the bottom portion. The bottom channel contacts can protrude from the BSG layer 12a, and a top surface of each of the bottom channel contacts can be positioned between the BSG layer 12a and the word line layer 12b.

Still referring to FIG. 8A, once the bottom channel contacts are formed, a barrier layer, a charge trapping layer, and a tunneling layer can be formed sequentially along the side portions of the channel openings and over the bottom channel contacts. A subsequent anisotropic plasma etching can be applied to remove portions of the barrier layer, the charge trapping layer, and the tunneling layer that are disposed over the bottom channel contacts to form a plurality of interconnect openings. Each interconnect opening exposes a respective bottom channel contact. A channel layer can be formed subsequently along the side portions of the channel openings and further extends through the interconnect openings to connect the bottom channel contacts.

Once the channel layer is formed, the channel layer can have side portions that are formed along the tunneling layer and a T-shaped bottom portion that extends through bottom portions of the tunneling layer, the charge trapping layer, and the barrier layer that are positioned over the bottom channel contact. The T-shaped bottom portion of the channel layer is in direct contact with the bottom channel contact, which can be shown in FIG. 2. In addition, the tunneling layer, the charge trapping layer, and the barrier layer can form an L-foot configuration in the channel openings. The L-foot configuration can include side portions that are formed along the sidewalls of the channel openings and a bottom portion over the bottom channel contacts.

In some embodiments, once the channel layer is formed, a subsequent annealing process can be applied to release wafer stress and also to reduce defects (dangling bonds). In some cases, the annealing process is also to transform the channel layer into polycrystalline. In some embodiments, the formation of the channel structure further includes forming a channel insulating layer over the channel layer to fill the channel openings, and forming a top channel contact over the channel insulating layer such that the top channel contact is in direct contact with the channel layer. A detailed channel structure can be illustrated in FIG. 2.

FIG. 8B is top down view to illustrate the formation of the channel structures 18. As shown in FIG. 8B, the channel structures 18 can be formed in the array region 100A. In addition, a plurality of dummy channel structures 36 can also be formed in the array region 100A. In some embodiments, the dummy channel structures 36 can be formed with the channel structures 18 together and have a similar structure to the channel structures 18. Thus, the dummy structures can also include a barrier layer, a trapping layer, a tunneling layer, and a channel layer. In some embodiments, the dummy channel structures 36 have a different structure to the channel structures 18. For example, the dummy channel structures 36 are made of a dielectric material, such as SiO, SiN, or our suitable dielectric materials. In some embodiments, the second dielectric trench structure 32 can extend across a first set of the dummy channel structures, and the first dielectric trench structure 34 can extend across a second set of the dummy channel structures. In some embodiments, the dummy channel structures 36 can be positioned away from the first and second dielectric trench structures 34 and 32. In some embodiments, the dummy channel structures 36 can further be formed in the staircase regions 100B and 100C. In an embodiment of FIG. 8B, the channel structures 18 and the dummy channel structures 36 can be arranged in 14 rows along the second direction of the substrate (e.g., Y direction), where the dummy channel structures 36 may be positioned in rows 5 and 10. Further, four rows (e.g., rows 6-9) of the channel structures can be arranged between the first dielectric trench structure 34 and the second dielectric trench structure 32.

Figure 9A:
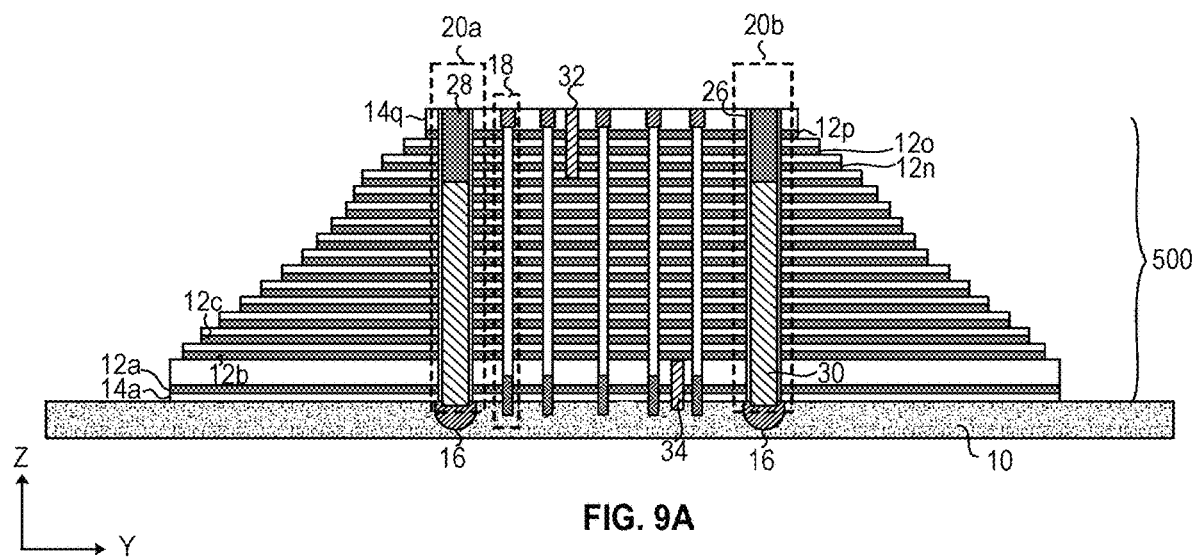
Figure 9B:
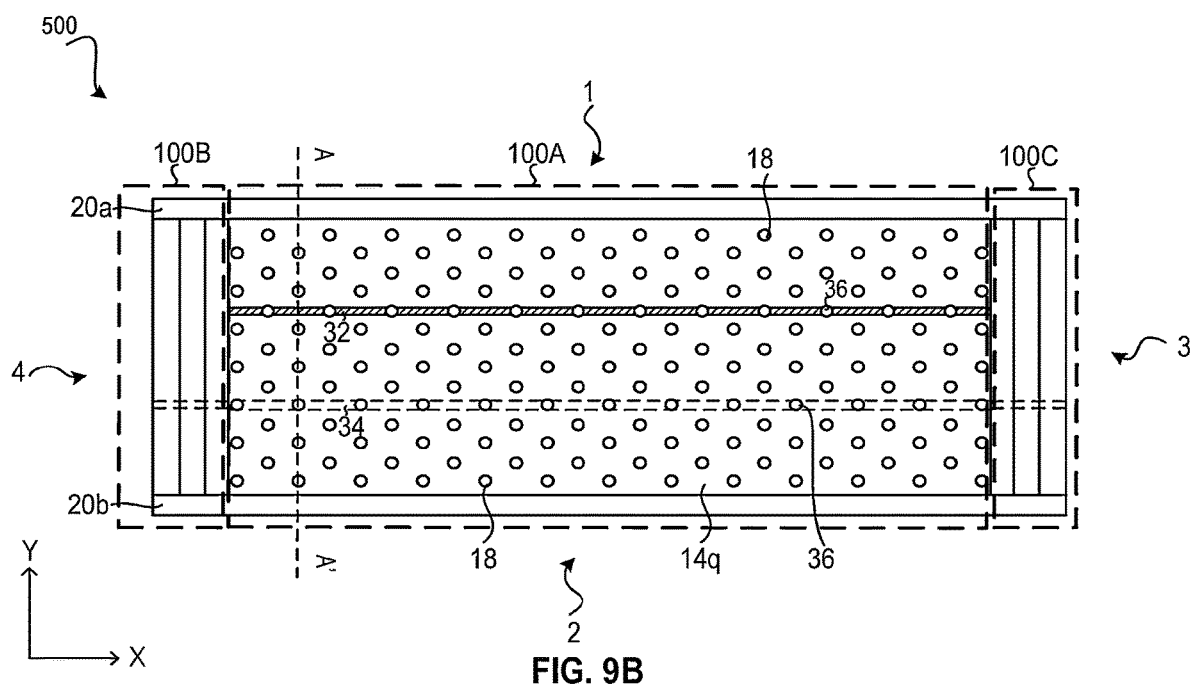

FIGS. 9A and 9B illustrate formation of slit structures 20a and 20b in the stack 500. FIG. 9A is a cross-sectional view of a substrate 10 and FIG. 9B is a top down view of the substrate 10, where the cross-sectional view in FIG. 9A is obtained from a line A-A' along the Z-direction (or height direction) of the substrate 10 in FIG. 9B. In order to form the slit structures 20a and 20b, a patterned mask can be positioned over the uppermost second insulating layer 14q of the stack 500 by a photolithography process, and a subsequent etching process can transfer patterns of the patterned mask into the word line layers, and the first and second insulating layers of the stack 500 to form slit openings (not shown). The stack 500 can have four boundaries 1-4. The slit openings can be positioned at a first boundary 1 and a second boundary 2 of the stack 500. The slit openings can pass through the word line layers, the second insulating layers, the first insulating layers 14a-14b, and the BSG layer 12a. The slit openings can further extend into the substrate 10. Each of the slit openings can have side portions and a bottom portion that extend into the substrate 10. The slit openings can further extend along the first direction (or length direction) of the substrate, and are disposed with the first and second dielectric trench structures 34 and 32 in parallel.

After the slit openings are formed, subsequent manufacturing steps to complete the formation of the slit structures can be different, for example between a gate first manufacturing flow and a gate last manufacturing flow. In the gate first manufacturing flow, an ion implantation can be subsequently applied to form a dope region, such as the doped region (also referred to array common source region) 16, at the bottom portion of each of the slit openings. A dielectric spacer, such as the dielectric spacer 26, can be formed along the side portions of the slit openings and over the doped regions. An anisotropic plasma etching can be implemented to remove a bottom portion of the dielectric spacer 26 formed over the doped regions 16 to expose the doped regions 16. A conductive layer, such as the conductive layer 30, can be deposited along the dielectric spacer 26 and fill the slit openings. The conductive layer 30 can be recessed afterward by an etching process, and a contact, such as the contact 28, can be formed along the dielectric spacer 26 and over the conductive layer 30. When the contact is formed, a slit structure is completed that has a same profile as the slit structures 20a and 20b in FIG. 9A. Accordingly, two slit structures 20a and 20b are formed at the first boundary 1 and the second boundary 2 of the stack 500.

However, in the gate last manufacturing flow, when the slit openings are formed, the word line layers and the BSG layer 12a are subsequently removed to form a plurality of vacancies (or empty spaces) by a wet etching chemical that is introduced through the slit openings. An ion implantation can be thereafter applied to form the doped region (e.g., ACS region 16) at the bottom portion of each of the slit openings. Following the implantation step, the word line layers and the BSG layer 12a are re-formed by filling the vacancies with a high-K layer plus metal layers through the slit openings. Next, a dielectric spacer, such as the dielectric spacer 26, can be formed along the side portions of the slit openings and over the doped regions 16. Subsequently, an anisotropic plasm etching can be implemented to remove a bottom portion of the dielectric spacer 26 formed over the doped regions 16 to expose the doped regions 16. A conductive layer, such as the conductive layer 30, can be deposited along the dielectric spacer 26 and fill the common source openings. The conductive layer 30 can be recessed afterward by an etching process, and a contact, such as the contact 28, can be formed along the dielectric spacer 26 and over the conductive layer 30. When the contact is formed, a slit structure is completed that has a same profile as the slit structures 20a and 20b in FIG. 9A.

Figure 10:
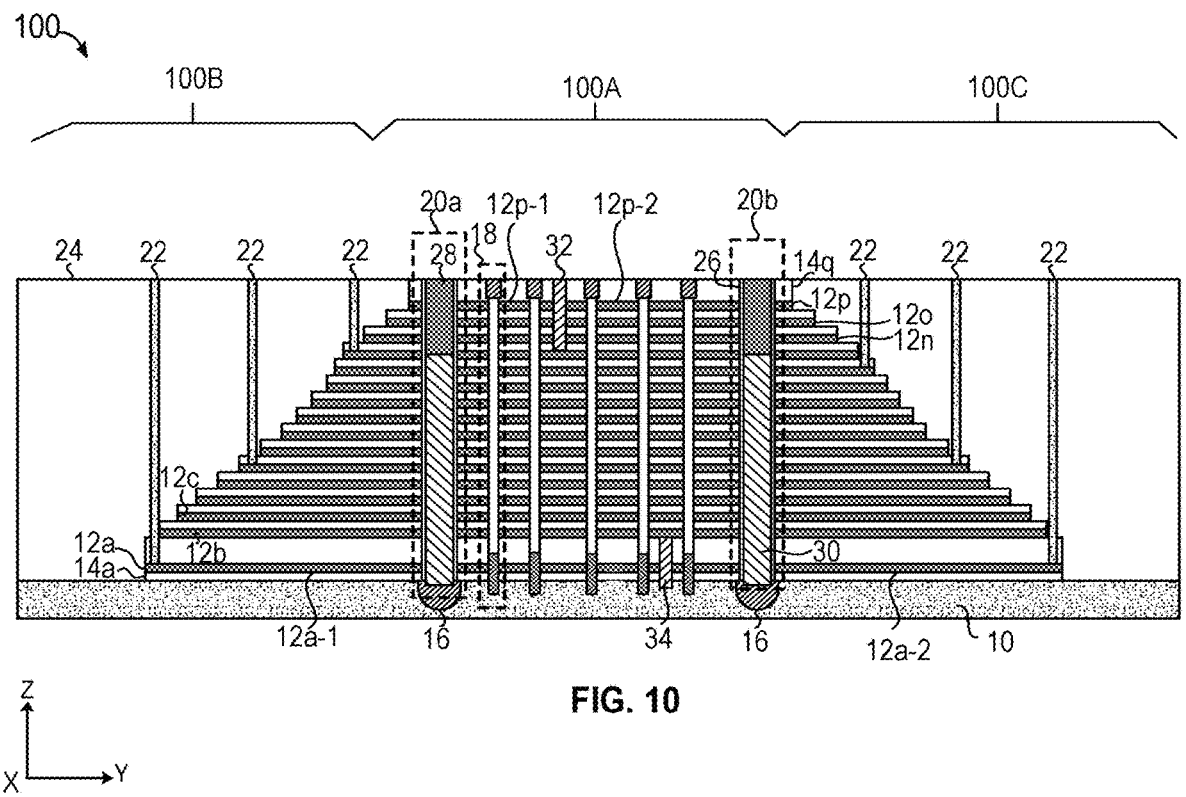

In FIG. 10, a plurality of contact structures 22 can be formed in the staircase regions 100B and 100C. In some embodiments, before the formation of the contact structures 22, a dielectric layer 24 can be formed over the substrate 10. The dielectric layer 24 can further cover the staircase regions 100B and 100C. A patterning process can be applied to form a plurality of contact openings in the dielectric layer 24. The contact openings can land on the first and second insulating layers and further extend through the first and second insulating layers to expose the word line layers and the BSG layer 12a. A deposition process can be subsequently applied to deposit a conductive material into the contact openings, and a CMP process can be applied to remove any excess conductive material over a top surface of the dielectric layer 24. When the CMP process is completed, the conductive material remaining in the contact openings becomes the contact structures 22. After the formation of the contact structures 22, a final 3D-NAND memory device 100 is formed in FIG. 10 such as the 3D-NAND memory device 100 illustrated in FIG. 1A.

Figure 11:
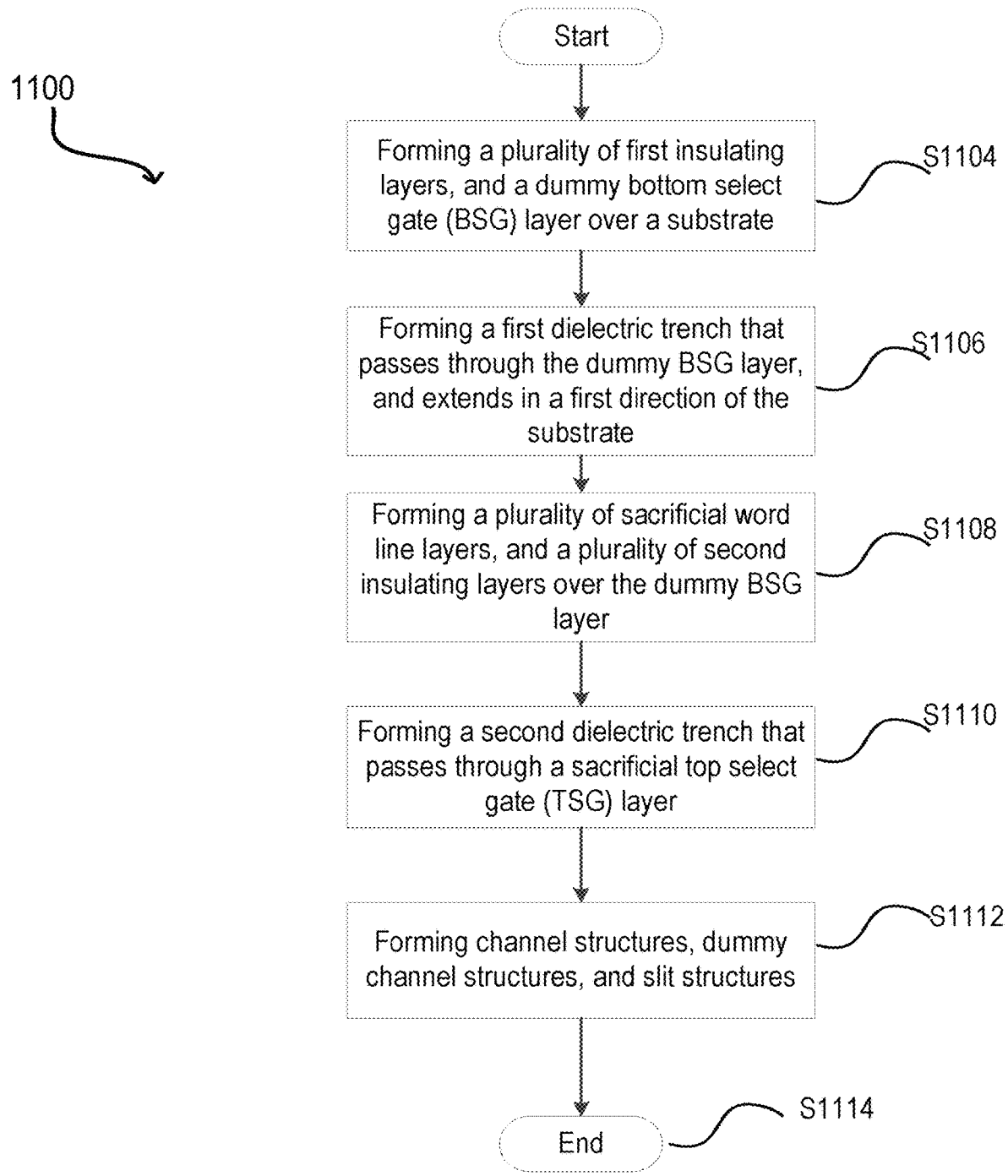
FIG. 11 is a flowchart of a process for manufacturing an exemplary 3D-NAND memory device, in accordance with exemplary embodiments of the disclosure.

FIG. 11 is a flowchart of a process 1100 for manufacturing a 3D-NAND memory device 100 in accordance with some embodiments. The process 1100 begins at step S1104 where a plurality of first insulating layers, and a dummy bottom select gate (BSG) layer can be formed over a substrate. The dummy BSG layer is disposed between the first insulating layers. In step S1106 of the process 1100, a first dielectric trench structure can be formed. The first dielectric trench structure passes through the dummy BSG layer, and extends in a first direction of the substrate so that the dummy BSG layer is separated by the first dielectric trench structure into two portions. In some embodiments, the steps S1104 and S1106 can be performed as illustrated with reference to FIGS. 4A and 4B.

The process 1100 then proceeds to step S1108 where a plurality of sacrificial word line layers, and a plurality of second insulating layers are formed over the first insulating layers. The second insulating layers and the sacrificial word line layers are disposed alternatingly. In some embodiments, the step S1108 can be performed as illustrated with reference to FIG. 5.

In step S1110, a second dielectric trench structure can be formed. The second dielectric trench structure can pass through a sacrificial top select gate (TSG) layer of the sacrificial word line layers to separate the sacrificial TSG layer into two portions and extends in the first direction of substrate. The second dielectric trench structure is offset from the first dielectric trench structure in a second direction of the substrate. In some embodiments, prior to the formation of the second dielectric trench structure, a trim-etch process can be applied on the first insulating layers, the dummy BSG layer, the second insulating layers, and the sacrificial word line layers to form an array region and staircase regions. In some embodiments, the step S1110 can be performed as illustrated with reference to FIGS. 6, 7A and 7B.

The process 1100 proceeds to step S1112 where channel structures, dummy channel structures, and slit structures can be formed. In some embodiments, before the formation of the slit structure, the dummy BSG layer and the sacrificial word line layers can be replaced with a BSG layer and word line layers respectively. In some embodiments, the steps S1112 can be performed as illustrated with reference to FIGS. 8A, 8B, 9A, 9B, and 10.

It should be noted that additional steps can be provided before, during, and after the process 1100, and some of the steps described can be replaced, eliminated, or performed in different order for additional embodiments of the process 1100. In an example, the staircase regions can be formed after the second dielectric trench structure is formed. In another example, the channel structures can be formed before the staircase region is formed. In some embodiments, the dummy channel structures can be formed in the staircase regions.

In subsequent process steps of the process 1100, various additional interconnect structures (e.g., metallization layers having conductive lines and/or vias) may be formed over the 3D-NAND memory device 100. Such interconnect structures electrically connect the 3D-NAND memory device 100 with other contact structures and/or active devices to form functional circuits. Additional device features such as passivation layers, input/output structures, and the like may also be formed.

The various embodiments described herein offer several advantages over related memory devices. For example, a related memory device either has a lower memory cell density or a non-functional sub-block. In the disclosed 3D-NAND memory device, a block of memory cells can have a first dielectric trench structure positioned in a bottom select gate (BSG) layer to separate the BSG layer into two portions, and a second dielectric trench structure positioned in a top select gate (TSG) layer to separate the TSG layer into two portions. The second dielectric trench structure is offset from the first dielectric trench structure. The disclosed configuration allows a higher channel structure density in the block by dividing the block into three independent and functional sub-blocks.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a stack of word line layers and insulating layers that are stacked alternatingly over a substrate;
a first dielectric trench structure positioned in a bottom select gate (BSG) layer of the word line layers to separate the BSG layer and extending in a first direction of the substrate; and
a second dielectric trench structure positioned in a top select gate (TSG) layer of the word line layers to separate the TSG layer and extending in the first direction of the substrate, the second dielectric trench structure being offset from the first dielectric trench structure in a second direction of the substrate that is perpendicular to the first direction, wherein the first dielectric trench structure and the second trench structure are positioned in an array region of the stack.

2. The semiconductor device of claim 1, further comprises:
a first slit structure positioned at a first boundary of the stack, the first slit structure extending through the stack and extending along the first direction of the substrate; and
a second slit structure positioned at a second boundary of the stack, the second slit structure extending through the stack and extending along the first direction of the substrate.

3. The semiconductor device of claim 2, wherein the first dielectric trench structure and the second dielectric trench structure are disposed between the first slit structure and the second slit structure in the second direction of the substrate.

4. The semiconductor device of claim 3, wherein the first dielectric trench structure, the second dielectric trench structure, the first slit structure, and the second slit structure extend parallel to each other in the first direction of the substrate.

5. The semiconductor device of claim 4, further comprising:
a plurality of channel structures that is formed over the substrate and further extends through the stack, the channel structures being disposed between the first slit structure and the second slit structure.

6. The semiconductor device of claim 5, further comprising:
a plurality of dummy channel structures that is formed over the substrate and further extends through the stack, the dummy channel structures being disposed between the first slit structure and the second slit structure.

7. The semiconductor device of claim 6, wherein the first dielectric trench structure extends across a first set of the dummy channel structures, and the second dielectric trench structure extends across a second set of the dummy channel structures.

8. The semiconductor device of claim 7, wherein the TSG layer is an uppermost word line layer of the word line layers.

9. The semiconductor device of claim 8, wherein the BSG layer is a lowermost word line layer of the word line layers.

10. The semiconductor device of claim 9, further comprising:
a first region that is defined by the first slit structure and the second dielectric trench structure;
a second region that is defined by the first dielectric trench structure and the second dielectric trench structure; and
a third region that is defined by the first dielectric trench structure and the second slit structure, wherein the first region, the second region, and the third region are configured to operate independently.

11. The semiconductor device of claim 10, wherein the channel structures and the dummy channel structures are arranged in 14 rows along the second direction of the substrate.

12. A semiconductor device, comprising:
a stack comprising word line layers and insulating layers that are alternatingly stacked over a substrate;
a first slit structure positioned at a first boundary of the stack, the first slit structure extending through the stack and along a first direction of the substrate;
a second slit structure positioned at a second boundary of the stack, the second slit structure extending through the stack and along the first direction of the substrate;
a first dielectric trench structure disposed between the first slit structure and the second slit structure, positioned in a bottom select gate (BSG) layer of the word line layers to separate the BSG layer, and extending in the first direction of the substrate; and
a second dielectric trench structure disposed between the first and second slit structures, positioned in a top select gate (TSG) layer of the word line layers to separate the TSG layer, and extending in the first direction of the substrate, the second dielectric trench structure being offset from the first dielectric trench structure in a second direction of the substrate, wherein the first dielectric trench structure and the second trench structure are positioned in an array region of the stack.

13. The semiconductor device of claim 12, wherein the first dielectric trench structure, the second dielectric trench structure, the first slit structure, and the second slit structure extend parallel to each other in the first direction of the substrate.

14. The semiconductor device of claim 12, further comprising:
a plurality of channel structures that is formed over the substrate and further extends through the word line layers and the insulating layers in the stack; and
a plurality of dummy channel structures that is formed over the substrate and further extends through the word line layers and the insulating layers in the stack, the first dielectric trench structure extending across a first set of the dummy channel structures, and the second dielectric trench structure extending across a second set of the dummy channel structures.

15. The semiconductor device of claim 14, wherein the channel structures and the dummy channel structures are arranged in 14 rows along the second direction of the substrate.

* * * * *